(12) United States Patent
Harada et al.

(10) Patent No.: US 6,600,385 B2
(45) Date of Patent: Jul. 29, 2003

(54) FRONT END MODULE FOR MOBILE COMMUNICATIONS APPARATUS

(75) Inventors: Nobumi Harada, Chuo-ku (JP); Satoshi Suga, Chuo-ku (JP); Hiroshi Tadano, Chuo-ku (JP); Hideki Hasegawa, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/799,569

(22) Filed: Mar. 7, 2001

(65) Prior Publication Data

US 2002/0021182 A1 Feb. 21, 2002

(30) Foreign Application Priority Data

Aug. 21, 2000 (JP) .................................... 2000-250393 U

(51) Int. Cl.⁷ .............................. H01P 1/10; H01P 1/213
(52) U.S. Cl. ........................................ 333/101; 333/134
(58) Field of Search ................................ 333/101, 202, 333/134, 219.1

(56) References Cited

U.S. PATENT DOCUMENTS

| 5,382,925 A | * | 1/1995 | Hayashi et al. ............. 333/112 |
| 5,783,976 A | | 7/1998 | Furutani et al. ............. 333/134 |
| 5,840,382 A | * | 11/1998 | Nishide et al. ............. 428/209 |
| 5,990,732 A | | 11/1999 | Furutani et al. ............. 327/565 |
| 5,999,065 A | | 12/1999 | Furutani et al. ............. 333/103 |
| 6,153,290 A | * | 11/2000 | Sunhara ...................... 428/210 |

FOREIGN PATENT DOCUMENTS

| EP | 0 998 035 A2 | 5/2000 |
| EP | 1 003 291 A2 | 5/2000 |
| JP | 9-261110 | 10/1997 |
| JP | 2983016 | 9/1999 |
| JP | 2000-165273 | 6/2000 |
| JP | 2000-165288 | 6/2000 |
| JP | 2000-183780 | 6/2000 |
| JP | 2000-201097 | 7/2000 |

* cited by examiner

Primary Examiner—Robert Pascal
Assistant Examiner—Dean Takaoka
(74) Attorney, Agent, or Firm—Oblon, Spivak, McClelland, Maier & Neustadt, P.C.

(57) ABSTRACT

The front-end module is composed of a multilayer substrate and surface-mounted components. The front end module constitutes antenna switches, filters, and a high frequency circuit comprising a band splitter circuit as well as the front end of the transceiver circuit equipped with a plurality of transmission/reception features whose communications systems are different. The multilayer substrate arranges a band splitter circuit pattern at the center in the plane direction and symmetrically arranges a plurality of antenna switch conductor patterns whose communications systems are different, with respect to the pattern for the band splitter circuit.

8 Claims, 4 Drawing Sheets

FRONT END MODULE FOR MOBILE COMMUNICATIONS APPARATUS

BACKGROUND OF THE INVENTION

The present invention relates to a front-end module having an antenna switch as a key component available in mobile communications apparatus such as a mobile telephone set and an automobile telephone set.

An antenna switch is disclosed in the Japanese Patent Publication No. 9-261110/(1997) proposed by the applicant of this invention is an example of a conventional front-end module for mobile communications apparatus. Most of the mobile telephone systems are set to different frequency bands between transmissions and receptions. Thus the element constant of such mobile telephone systems tend to differ between the transmission/reception selector and the antenna selector, although these circuits are similar to each other. In order to avoid disadvantages in a quick design, the antenna switch described in the Japanese Patent Publication No. 9-261110/(1997) has a selector circuit where one selector of the transmission/reception selector and the antenna selector and the other are symmetrical with respect to a low-pass filter.

The aforementioned example of the related art is an antenna switch used for mobile telephone sets of TDMA system and cannot be applied to telephone sets that cover two transmission/reception systems, such as the GSM dualband mobile telephone sets in Europe. Thus a front-end module comprising a circuit for splitting two bands and mainly an antenna switch is in need. The multilayer substrate for the front-end module must comprise a great number of circuit elements. This complicates the design of the multilayer substrate, and easily invites interference between circuits and deformation in the laminating and firing processes, thus worsening the yield.

SUMMARY OF THE INVENTION

The invention aims at providing a multilayer-substrate front-end module covering a plurality of transmission/reception systems, wherein materials for layers composing circuit elements are optimized and a scaled-down multilayer substrate causes a negligible interference between circuits.

A front end module according to the first aspect of the invention is a front end module used for a plurality of different communications systems, comprising at least a band splitter circuit connected to an antenna, an antenna switch connected to the antenna via the band splitter circuit to switch the antenna to transmitter circuits and receiver circuits of different communications systems, and a filter for removing high frequencies, characterized in that the front end circuit constitute an integrated module with components mounted on a multilayer substrate, that said multilayer substrate arranges a pattern for a band splitter circuit at the center in the place direction, and that a plurality of antenna switch conductor patterns using different communications systems are symmetrically arranged with respect to the pattern for the band splitter circuit.

According to the second aspect of the invention, in the front end module according to the first aspect of the invention, said multilayer substrate is composed of a plurality of laminated dielectric layers, that the dielectric layers constituting said multilayer substrate are split into a plurality of dielectric layers laminated adjacently where coil conductor patterns are mainly formed, and a plurality of dielectric layers laminated adjacently where capacitor electrode patterns are mainly formed, and that said dielectric layers where coil conductor patterns are mainly formed select a material that shows a dielectric constant lower than that of said dielectric layers where capacitor electrode patterns are mainly formed.

According to the third aspect of the invention, in the front-end module according to the second aspect of the invention, the dielectric layers laminated adjacently where capacitor electrode patterns are mainly formed are provided beneath the dielectric layers laminated adjacently where coil conductor patterns are mainly formed and, that layers comprising a similar material to that of the dielectric layers where capacitor electrode patterns are mainly formed are provided on top of said dielectric layers where coil conductor patterns are mainly formed, in order to prevent deformation caused by the difference in the reduction ratio that accompanies firing.

According to the fourth aspect of the invention, in the front end module according to any of the first through third aspects of the invention, the antenna switch is composed of at least a diode and at least an LC circuit, and said filter and said band splitter circuit are composed of LC circuits, that said LC circuits are formed in said multilayer substrate, and that part of said LC circuits is connected to a diode arranged on the upper face of said multilayer substrate through a via hole.

DETAILED DESCRIPTION OF THE DRAWINGS

Figure 1:
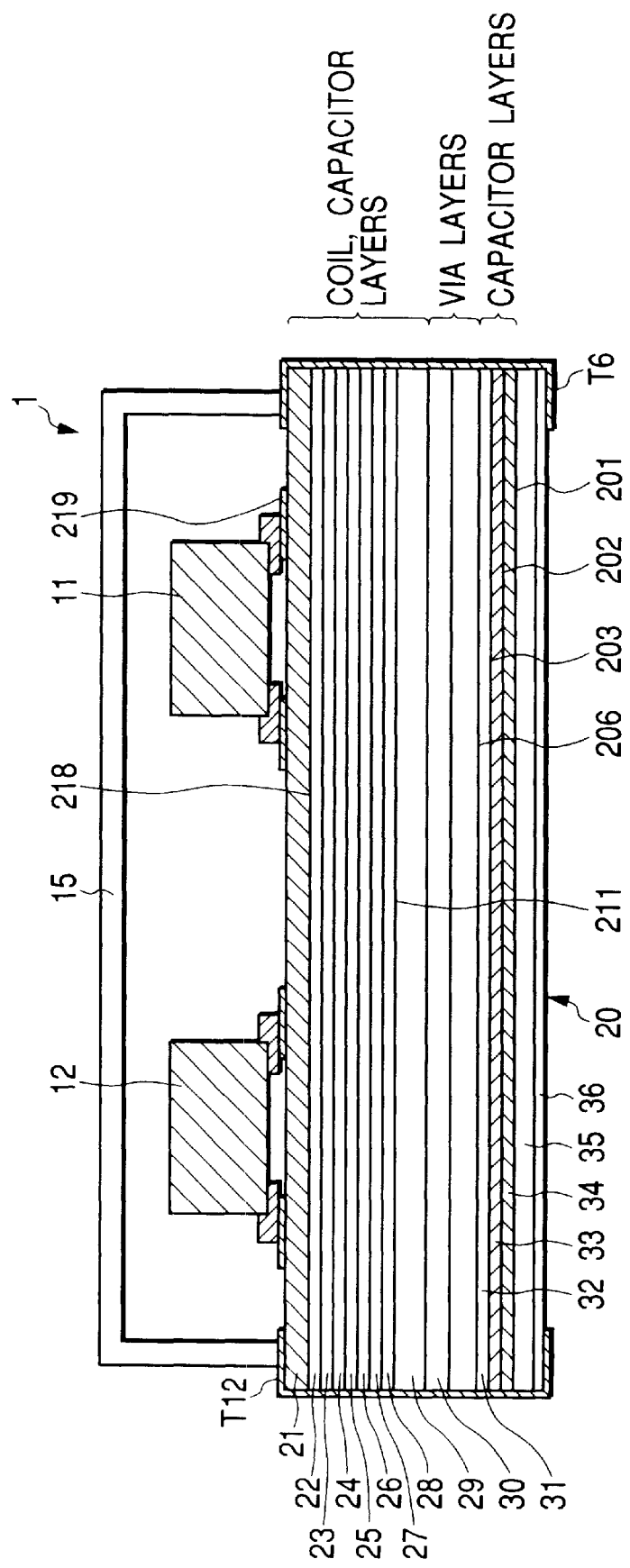
FIG. 1 is a cross sectional view showing an embodiment of a front-end module of the invention.

An embodiment of the invention will be explained referring to the drawings. FIG. 1 is a cross sectional view showing a front-end module. A front-end module 1 mounts surface-mounted components 11, 12 on a multilayer substrate 20. A shield case 15 is fixed to the multilayer substrate 20 so as to cover the multilayer substrate 20 and the surface-mounted components 11, 12.

The multilayer substrate 20 is composed of dielectric layers 21 through 36. In FIG. 1, each of the dielectric layers 21 through 36 is shown in a thickness corresponding to its actual thickness.

Figure 2:
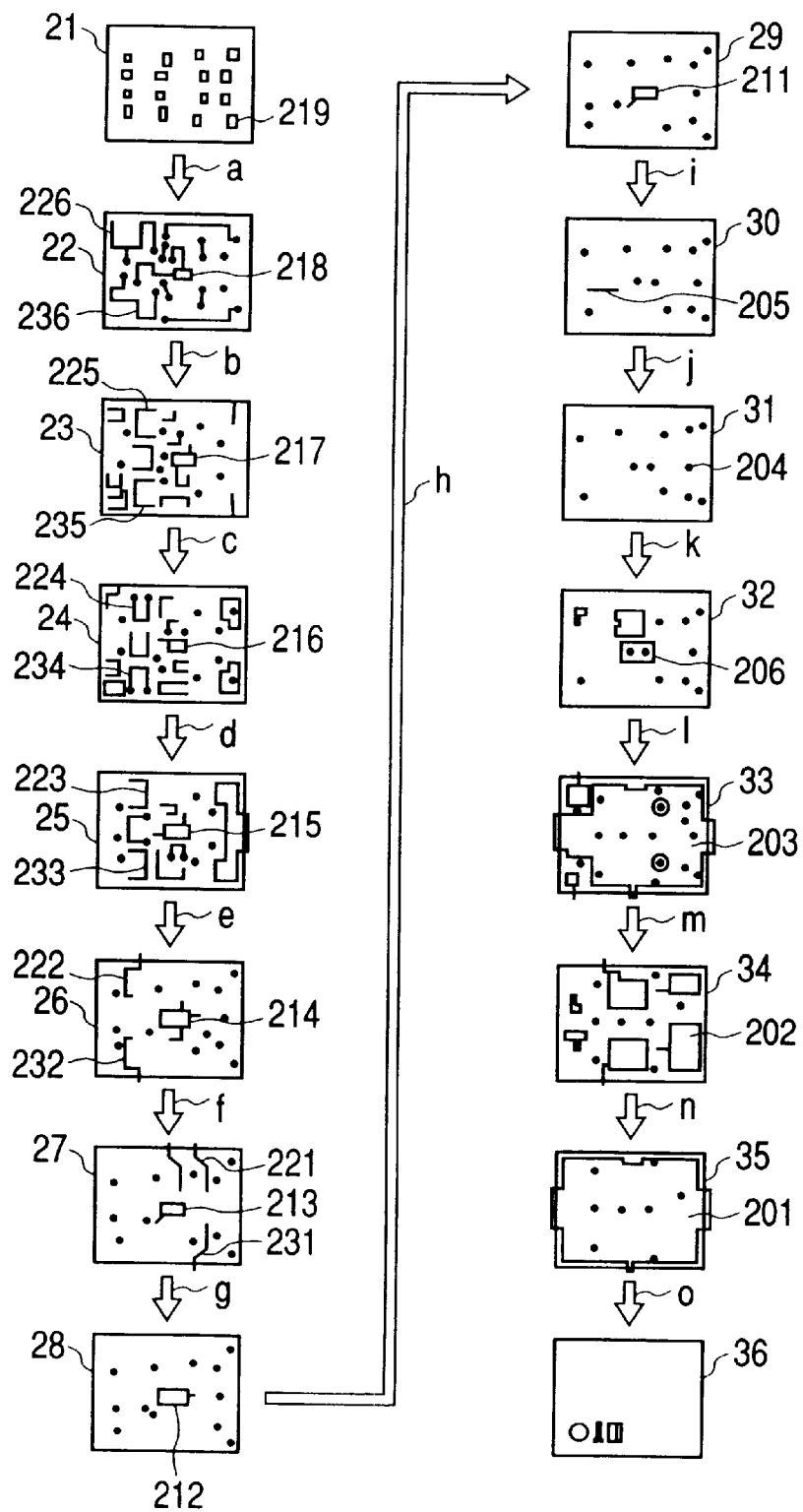
FIG. 2 shows patterns formed on dielectric layers of a multilayer substrate according to the embodiment.

FIG. 2 shows the layer configuration of the front-end module. The front end module laminates dielectric green sheets where electrodes, connection patterns, via holes or marks corresponding to a great number of front end modules are arranged vertically and horizontally, cuts the sheets into materials for individual front end modules, heats and press the sheets, then fire the sheets to manufacture individual multilayer substrates 20 as shown in FIG. 1.

In FIG. 2, numerals 21 through 36 are the dielectric layers shown in FIG. 1. These dielectric layers are dielectric green sheets in the manufacturing process. Arrows a through o means laminating. In the laminating process, a green sheet 36 as a dielectric layer is the lowest layer, on top of which is placed a green sheet 35 as a dielectric layer, on top of which is placed a green sheet 34 as a dielectric layer, and so on until green sheets 21 through 36 are laminated. These green sheets are integrated as a fired material in the heating/pressing process and firing process after cutting. Dimensions of these green sheets change according to the reduction ratio that accompanies firing and the green sheets become dielectric layers having predetermined electrical characteristics via firing.

Figure 3:
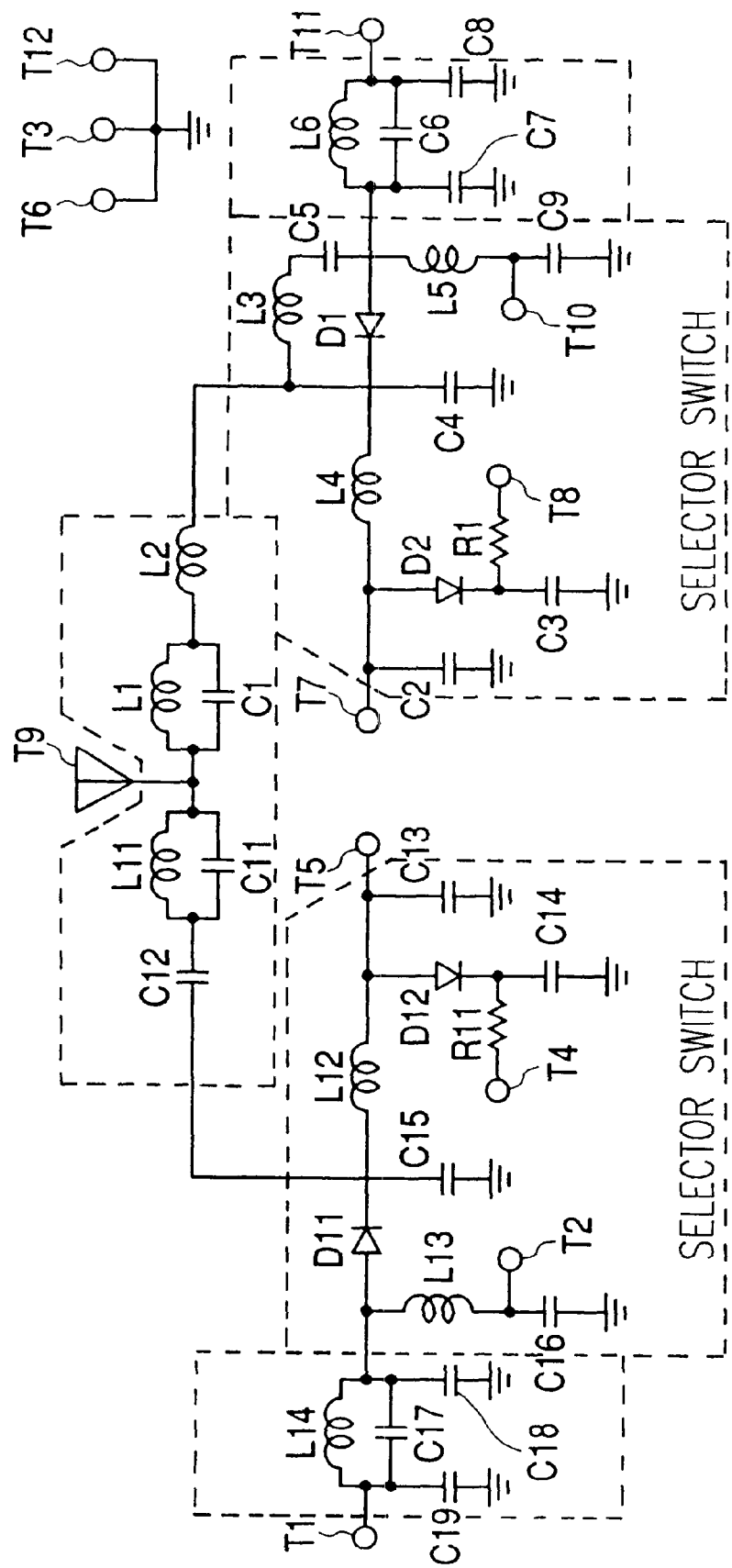
FIG. 3 is a circuit diagram showing an example of circuit configuration of the front-end module according to the embodiment.

FIG. 3 is a circuit diagram showing an example of circuit configuration of the front-end module 1. In FIG. 3, signs T1 through T12 are external connection electrodes. The external connection electrode T9 is an external connection electrode to the antenna. Coils L1, L2, L11 and capacitors C1, C11, C12 constitute a band splitter circuit. The circuit from the coil L1 and the capacitor C1 to the external connection electrode T11 (circuit on the right in the figure) is a circuit supporting the DCS system (1.8 GHz band). The circuit from the coil L11 and the capacitor C11 to the external connection electrode T1 (circuit on the left in the figure) is a circuit supporting the GSM system (900 MHz band).

In the circuit on the right supporting the DCS system, T11 is an external connection electrode connected to a transmitter circuit of the DCS system. T7 is an external connection electrode connected to a receiver circuit of the DCS system. T8 is an external connection electrode grounded by an external circuit. T10 is an external connection electrode for applying a control signal to switch between transmission and reception for the DCS system. A coil L6 and capacitors C6 through C8 constitute a low-pass filter. Diodes D1, D2, coils L3 through L5, and capacitors C2 through C5 and C9 constitute a transmission/reception selector switch.

In the circuit on the left supporting the GSM system, T1 is an external connection electrode connected to a transmitter circuit of the GSM system. T5 is an external connection electrode connected to a receiver circuit of the GSM system. T2 is an external connection electrode for applying a control signal to switch between transmission and reception for the GSM system. T4 is an external connection electrode grounded by an external circuit. A coil L14 and capacitors C17 through C19 constitute a low-pass filter. Diodes D11, D12, coils L12, L13, capacitors C13 through C16 constitute a transmission/reception selector switch. T3, T6, T12 are external connection electrodes connected to ground electrodes inside the front-end module.

Figure 4:
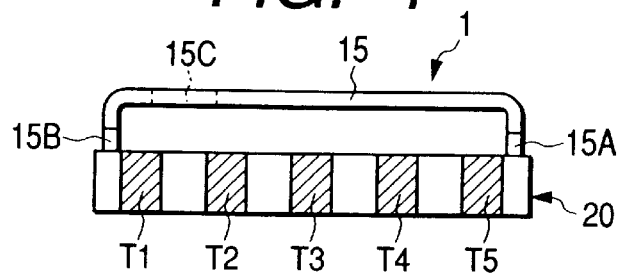
FIG. 4 is a front view of the front-end module according to the embodiment in the same direction as FIG. 1.
Figure 5:
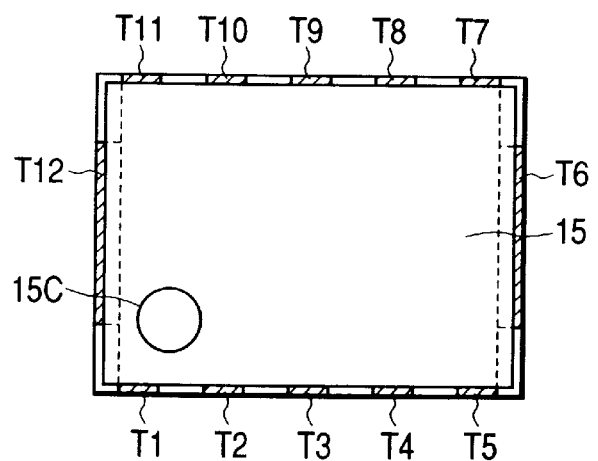
FIG. 5 is a plane view of the front end module according to the embodiment.
Figure 6:
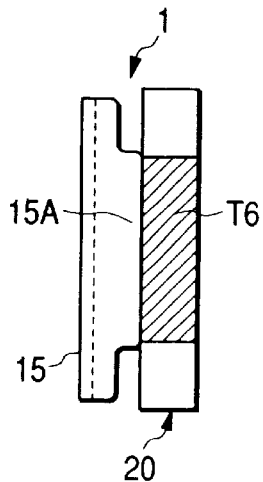
FIG. 6 is a side view of the front-end module according to the embodiment.

FIGS. 4 through 6 are external views of the front-end module 1. FIG. 4 is a front view in the same direction as FIG. 1. FIG. 5 is a plane view and FIG. 6 is a side view in the direction orthogonal to the direction of FIG. 4. As shown in FIGS. 4 and 6, the right and left ends (top of the figure) of the shield case 15 are bent downward to lie at right angles to the plane section. Ends 15A, 15B that are bent are respectively fixed to external connection electrodes T6, T12 as ground electrodes. In FIG. 4, said surface-mounted components 11, 12 are not shown.

In FIG. 5, 15C is a hole made in the shield case 15 that shows the direction of the front-end module 1. As shown in FIG. 5, external connection electrodes T1 through T12 for connecting circuits of said front-end module are arranged on the periphery of the front-end module. These external connection electrodes T1 through T12 are used to mount to connect the front-end module on a circuit substrate of a mobile telephone set.

The front-end module in this example has a height of 1.8 mm including the shield case, a horizontal width of 6.5 mm in FIG. 5, and a vertical width of 4.8 mm.

The configuration of the front-end module will be detailed. As shown in FIGS. 1 and 2, a ground electrode pattern 201 is formed on almost the entire surface of the dielectric layer 35 in the lower section. A facing electrode pattern 202 of the ground capacitor is formed on the dielectric layer 34 adjacent to the dielectric layer 35. While a plurality of facing electrode patterns are formed as well as said facing electrode pattern 202, signs are omitted for clarity. A ground pattern 203 and other electrode patterns whose signs are omitted are formed on the dielectric layer 33 adjacent to the dielectric layer 34.

Above said ground capacitors are laminated dielectric layers 28 through 32 where few patterns are formed. On these dielectric layers 28 through 32 are formed a via hole 204 for connecting patterns on vertically adjacent dielectric layers, a connection pattern 205 for connecting via holes, an electrode pattern 206, other electrode patterns whose signs are omitted, and some of the capacitor electrode patterns for the band splitter circuit.

Then, dielectric layers 22 through 27 are laminated above. On these dielectric layers 22 through 27 are formed coils and capacitors made by using coil conductor patterns and capacitor electrode patterns.

Electrode patterns 211 through 218 are capacitor electrode patterns for the band splitter circuit. The capacitor electrode patterns for the band splitter circuit 211 through 218 are formed to be located at the center in vertical direction in the figure, that is, at the center of the plane, in each of the dielectric layers 22 through 29 in FIG. 2. On each of the dielectric layers 22 through 26 are formed circuits supporting the DCS system in the upper section and circuits supporting the GSM system in the lower section in the figure.

On the dielectric layer 27 is formed a connection pattern 221 for the DCS system in the upper section in the figure. On the dielectric layers 22 through 26 are formed coil conductor patterns 222 through 226 for the DCS system in the upper section in the figure.

On the dielectric layer 27 is formed a connection pattern 231 for the GSM system in the lower section in the figure. On the dielectric layers 22 through 26 are formed coil conductor patterns 232 through 236 for the GSM system in the lower section in the figure.

Since the module is used in high frequencies, that is, in the GSM system and the DCS system, patterns forming said elements must be arranged considering mutual interference. In particular the band of the DCS system is about the double of that of the GSM system. Thus it is necessary to consider the effects on the second harmonic of the GSM transmitter system. In the configuration in FIG. 2, a circuit supporting the DCS system and a circuit supporting the GSM system arranged substantially symmetrically with respect to the capacitor electrode patterns for the band splitter circuit 211 through 218 shared by both circuits. It is possible to reduce the entire circuits by placing the capacitor electrode patterns for the band splitter circuit 211 through 218 between both circuits most efficiently.

On the dielectric layer 21 is formed a connection pattern 219. On the connection pattern 219 are connected and mounted surface-mounted components 11, 12. The surface-mounted components 11, 12 are diodes, chip resistors, chip capacitors or chip inductors and arranged as required according to the circuit configuration.

Said connection pattern 219 is connected to a corresponding via hole according to the circuit configuration. Among the external connection electrodes T1 through T12, for example external connection electrodes T8, T4 are connected to connection patterns 221, 231 as internal electrode drawing patterns.

In this embodiment, arrangement of the dielectric layers 21 through 36 shown in FIGS. 1 and 2 is determined considering the electrical characteristics and the reduction ratio that accompanies firing of green sheets. The uppermost dielectric layer 21 has a dielectric constant of about 11 and a green sheet with a smaller reduction ratio is selected. Dielectric layers 22 through 32 below the dielectric layer 21 have a dielectric constant of about 7.3 and green sheets with a slightly larger reduction ratio are selected. Dielectric layers 33, 34 below the dielectric layers 22 through 32 have a dielectric constant of about 11, same as the uppermost dielectric layer 21, and green sheets with a smaller reduction ratio are selected. Dielectric layers 35, 36 below the dielectric layers 33, 34 have a dielectric constant of about 7.3, same as the dielectric layers 22 through 32, and green sheets with a slightly larger reduction ratio are selected.

The dielectric layers 22 through 26 mainly form coil conductor patterns and the dielectric layers 27 through 32 mainly form connection patterns. A material having a dielectric constant of about 7.3 is selected for each of the dielectric layers 22 through 32. These dielectric layers 22 through 32, with low dielectric constant, serve to prevent interference with the adjacent pattern caused by floating capacity. The dielectric layers 33, 34 are dielectric layers between electrodes constituting capacitors and a material having a dielectric constant of about 11 is selected for each of them. It is thus easy to obtain capacity as a capacitor. However, the dielectric layers 33, 34 have a small reduction ratio that accompanies firing and the dielectric layers 22 through 32 have a larger reduction ratio, thus causing deformation during firing. It is possible to prevent deformation during firing by selecting a material with small reduction ratio, same as the dielectric layers 33, 34, for the uppermost dielectric layer 21.

The antenna switch is composed of a diode and an LC circuit, with the LC circuit formed in a multilayer substrate. This eliminates the need for considering the impedance matching of the strip lines, unlike a conventional configuration via diodes, capacitors and λ/4 strip lines generally used in high-frequency circuits. It is not necessary to provide a dielectric layer for matching the impedance, thus providing a more low-thickness multilayer substrate.

As mentioned earlier, according to the invention, the following advantages are obtained via aforementioned configuration of a front-end module for mobile communications apparatus:

(1) In integrating a transceiver circuit equipped with a plurality of transmission/reception features whose communications systems are different, the multilayer substrate arranges a band splitter circuit pattern at the center in the plane direction and arranges transceiver circuits equipped with a plurality of transmission/reception features whose communications systems are different, symmetrically with regard to the band splitter circuit pattern, in order to prevent interference between both circuits via the band splitter circuit pattern, thus assuring scale-down of the entire multilayer substrate.

(2) A plurality of dielectric layers where coil conductor patterns are mainly formed are arranged adjacently in the laminating direction as dielectric layers. Separately, a plurality of dielectric layers where capacitor electrode patterns are mainly formed are arranged adjacently in the laminating direction. It is possible to prevent interference with the adjacent pattern in the laminating direction caused by floating capacity, by selecting a material for a plurality of dielectric layers where coil conductor patterns are mainly formed, having a dielectric constant smaller than that of the dielectric layers where capacitor electrode patterns are mainly formed. The dielectric layers where capacitor electrode patterns are mainly formed can easily obtain capacity as a capacitor. This assures scale-down of the entire multilayer substrate.

(3) Dielectric layers where capacitor electrode patterns are mainly formed are laminated adjacently below layers where coil conductor patterns are mainly formed and dielectric layers comprising a similar material to that of the dielectric layers where capacitor electrode patterns are mainly formed are provided on top of said dielectric layers where coil conductor patterns are mainly formed. This prevents deformation during sintering caused by the difference in the reduction ratio.

(4) An antenna switch is composed of a diode and an LC circuit, with the LC circuit formed in a multilayer substrate. This eliminates the need for considering the impedance matching of the strip lines, unlike a conventional configuration via diodes, capacitors and λ/4 strip lines generally used in high-frequency circuits. It is not necessary to provide a dielectric layer for matching the impedance, thus providing a more low-thickness multilayer substrate.

What is claimed is:

1. A front-end module used for a plurality of different communications systems, comprising:
   a band splitter circuit connected to an antenna and constituting a band splitter pattern;
   plural antenna switches, connected to the antenna via the band splitter circuit, and configured to switch the antenna to transmitter circuits and receiver circuits of different respective communications systems, said antenna switches constituting respective antenna switch conductor patterns; and
   plural filters for removing high frequencies;
   wherein:
      the front end module includes components mounted on a multilayer substrate, bearing capacitor electrode patterns within said band splitter pattern; and
      the capacitor electrode patterns are at a location about which coil conductor patterns of said antenna switch conductor patterns are symmetrically arranged.

2. A front-end module according to claim 1, wherein said multilayer substrate includes a plurality of laminated dielectric layers including:
   1) a first plurality of dielectric layers laminated adjacently where the coil conductor patterns are mainly formed, and
   2) a second plurality of dielectric layers laminated adjacently where the capacitor electrode patterns are mainly formed.

3. A front-end module according to claim 2, wherein:
   some of the second plurality of dielectric layers are provided beneath the first plurality of dielectric layers, and
   layers comprising a similar material to that of the second plurality of dielectric layers are provided on top of said first dielectric layers, in order to prevent deformation caused by the difference in the reduction ratio that accompanies firing.

4. A front end module according to any of claims 1 through 3, wherein:
said antenna switch includes at least a diode and at least an LC circuit,
said filter and said band splitter circuit include LC circuits,
said LC circuits are formed in said multilayer substrate, and
part of said LC circuits is connected to a diode arranged on the upper face of said multilayer substrate through a via hole.

5. A front-end module according to claim 4, wherein:
said LC circuit is connected to at least one of a resistor, a chip-coil and a chip-capacitor arranged on the upper face of said multilayer substrate.

6. A front-end module used for a plurality of different communications systems, comprising:
a band splitter circuit connected to an antenna and constituting a band splitter pattern;
plural antenna switches, connected to the antenna via the band splitter circuit, and configured to switch the antenna to transmitter circuits and receiver circuits of different respective communications systems, said antenna switches constituting respective antenna switch conductor patterns; and
plural filters for removing high frequencies from respective pathways between the antenna switches and respective ones of the transmitter circuits;
wherein:
said antenna switches include at least a diode and at least an LC circuit,
said filter and said band splitter circuit are composed of LC circuits,
said LC circuits are formed in a multilayer substrate, and
part of said LC circuits is connected to a diode arranged on the upper face of said multilayer substrate through a via hole, and
wherein said multilayer substrate includes a plurality of laminated dielectric layers including:
a first plurality of dielectric layers laminated adjacently where coil conductor patterns are mainly formed, and
a second plurality of dielectric layers laminated adjacently where capacitor electrode patterns are mainly formed.

7. A front-end module according to claim 6, wherein:
some of the second plurality of dielectric layers are provided beneath the first plurality of dielectric layers, and
layers comprising a similar material to that of the second plurality of dielectric layers are provided on top of said first plurality of dielectric layers, in order to prevent deformation caused by the difference in the reduction ratio that accompanies firing.

8. A front-end module according to any of claims 6 or 7, wherein:
said LC circuit is connected to at least one of a resistor, a chip-coil and a chip-capacitor arranged on the upper face of said multilayer substrate.

* * * * *